(12) United States Patent  
Mazumder et al.

(10) Patent No.: US 9,118,309 B2  
(45) Date of Patent: Aug. 25, 2015

(54) SHIFTER CAN AVOID UTILIZING PARTIAL PULSE

(71) Applicants: Kallol Mazumder, Plano, TX (US); Scott Smith, Plano, TX (US)

(72) Inventors: Kallol Mazumder, Plano, TX (US); Scott Smith, Plano, TX (US)

(73) Assignee: NANYA TECHNOLOGY CORP., Gueishan Dist., Taoyuan (TW)

( * ) Notice: Subject to any disclaimer, the term of this patent is extended or adjusted under 35 U.S.C. 154(b) by 153 days.

(21) Appl. No.: 13/654,421

(22) Filed: Oct. 18, 2012

(65) Prior Publication Data

US 2014/0111263 A1 Apr. 24, 2014

(51) Int. Cl.
*H03K 3/00* (2006.01)
*H03K 3/037* (2006.01)

(52) U.S. Cl.
CPC .................................. *H03K 3/0375* (2013.01)

(58) Field of Classification Search
CPC ... H03K 3/012; H03K 3/35625; G11C 19/00; G11C 19/28; G11C 2029/3202
See application file for complete search history.

(56) References Cited

U.S. PATENT DOCUMENTS 5,422,760 A * 6/1995 Abbott et al. ................... 360/46
2007/0001733 A1* 1/2007 Branch et al. ................. 327/218

* cited by examiner

*Primary Examiner* — Sibin Chen
(74) *Attorney, Agent, or Firm* — Winston Hsu; Scott Margo

(57) ABSTRACT

A shifter that can avoid utilizing a partial pulse, comprising: at least one shifting stage, for receiving an external clock signal or a command triggering clock signal to generate sampling signals according a command signal; and a command triggering clock signal generating circuit, for generating the command triggering clock signal according to the command signal. The shifting stage utilizes the external clock signal to generate the sampling signal but does not utilize the command triggering clock signal to generate the sampling signal, if the command triggering clock signal may have a partial pulse for a cycle that the shifting stage generates the sampling signal.

5 Claims, 4 Drawing Sheets

SHIFTER CAN AVOID UTILIZING PARTIAL PULSE

BACKGROUND OF THE INVENTION

1. Field of the Invention

The present invention relates to a shifter, and particularly relates to a shifter that can avoid utilizing a partial pulse.

2. Description of the Prior Art

FIG. 1 is a block diagram illustrating a prior art shifter 100. As shown in FIG. 1, the shifter 100 includes a plurality of shifting stages 101, 103, and 105 coupled in series. The shifting stage 101 samples a command signal CMD Φ according to an external clock signal CLKE (also named a free running clock signal). However, if all shifting stages utilize the external clock signal CLKE to sample the command signal, the external clock signal source must drive a large load, thus high power is needed.

Therefore, the shifter 100 may further includes a command triggering clock signal generating circuit 107 to generate a command triggering clock signal CLKC (also named a local clock signal). The command triggering clock signal CLKC is generated when a command signal arrives (such as CMD Φ in this embodiment). The command triggering clock signal CLKC does not run all the time but remains on during the time when the command signal shifts around the shifting stages. In the example of FIG. 2, the shifting stages after the shifting stage 101, that is, the shifting stages 103, 105, both utilize the triggering clock signal CLKC to sample the command signal output from the previous shifting stage.

However, the command triggering clock signal CLKC may have the issue of "partial pulse". FIG. 2 is a schematic diagram illustrating the external clock signal CLKE and the command triggering clock signal CLKC applied to the shifter in FIG. 1. As shown in FIG. 2, the first pulse P1 of the command triggering clock signal CLKC may have an uncomplete pulse width due to different paths for the external clock signal CLKE and the command signal CMDΦ. Such situation is called "partial pulse". If such partial pulse is utilized to sample a command, the shifting stage may enter a unstable state, causing unexpected behavior at the output of this shifting stage. If this happens, it may corrupt the shift-chain and cause command-fail.

FIG. 3 is a timing diagram illustrating the relations between the clock signals and the command signals for the example shown in FIG. 1. The above-mentioned "partial pulse" issue can be understood more clearly via FIG. 3. AS shown in FIG. 3, the rising edge ed1 of the external clock signal CLKE is utilized to sample the command signal CMDΦ to generate a high level of the command signal CMD1. In a normal situation, the high level of the command signal CMD 2 is supposed to occur at the timing T1 via sampling the command signal CMD1 by the rising edge ed2 of the command triggering clock signal CLKC. However, in FIG. 3 the high level of the command signal CMD 2 occurs at a wrong timing T2 since the command signal CMD1 is sampled by the rising edge ed3 of the partial pulse P1. Accordingly, the command signal CMD2 is wrongly generated, therefore other command signals generated according to the command signal CMD2 may also have error.

SUMMARY OF THE INVENTION

One objective of the present invention is to provide a shifter that does not utilize the command triggering clock signal when the command triggering clock signal is possible to have a partial pulse.

Therefore, one embodiment of the present invention discloses a shifter that can avoid utilizing a partial pulse, comprising: at least one shifting stage, for receiving an external clock signal or a command triggering clock signal to generate sampling signals according a command signal; and a command triggering clock signal generating circuit, for generating the command triggering clock signal according to the command signal. The shifting stage utilizes the external clock signal to generate the sampling signal but does not utilize the command triggering clock signal to generate the sampling signal, if the command triggering clock signal may have a partial pulse for a cycle that the shifting stage generates the sampling signal.

Another embodiment of the present invention discloses: a shifter that can avoid utilizing a partial pulse, comprising: a first shifting stage, for utilizing an external clock signal to sample a command signal to generate a first sampled command signal; a second shifting stage, for utilizing the external clock signal to sample the first sampled command signal to generate a second sampled command signal; a third shifting stage, for utilizing a command triggering clock signal to generate a third sampled command signal according to the second sampled command signal; and a command triggering clock signal generating circuit, for generating the command triggering clock signal according to the command signal.

In view of above-mentioned embodiments, the shifter can avoid utilizing the partial pulse to wrongly sample a command signal, since the command triggering clock signal CLKC is not utilized to sample the command signal during the cycle that CLKC is possible to have partial pulse.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 4:
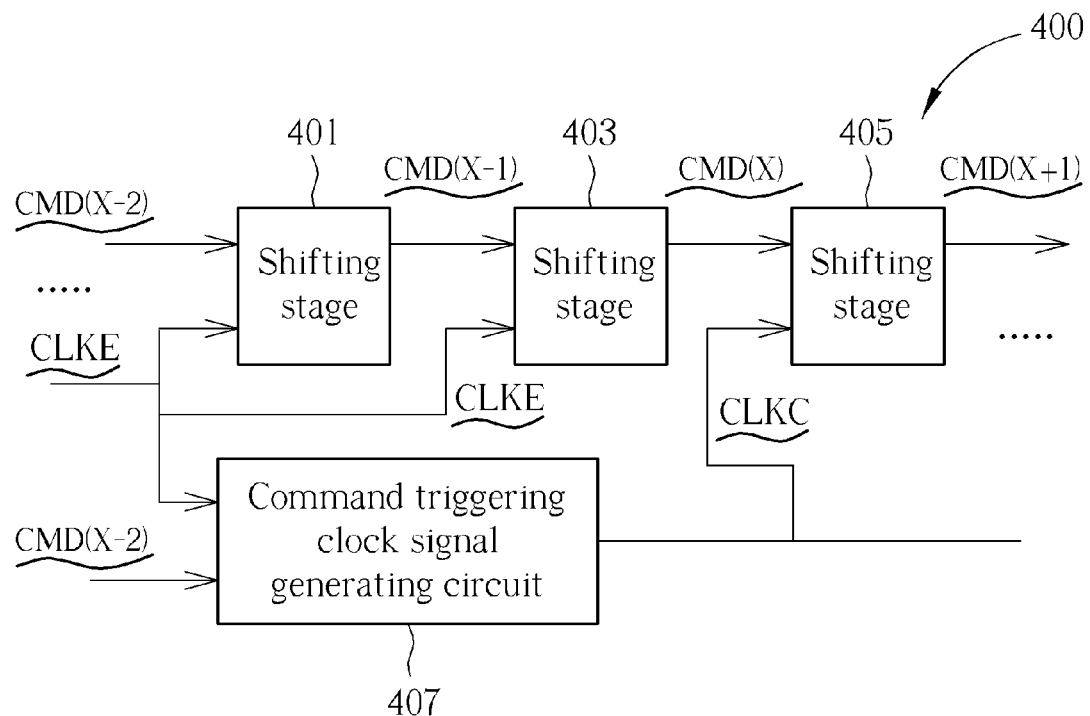
FIG. 4 is a block diagram illustrating a shifter according to one embodiment of the present invention.
Figure 5:
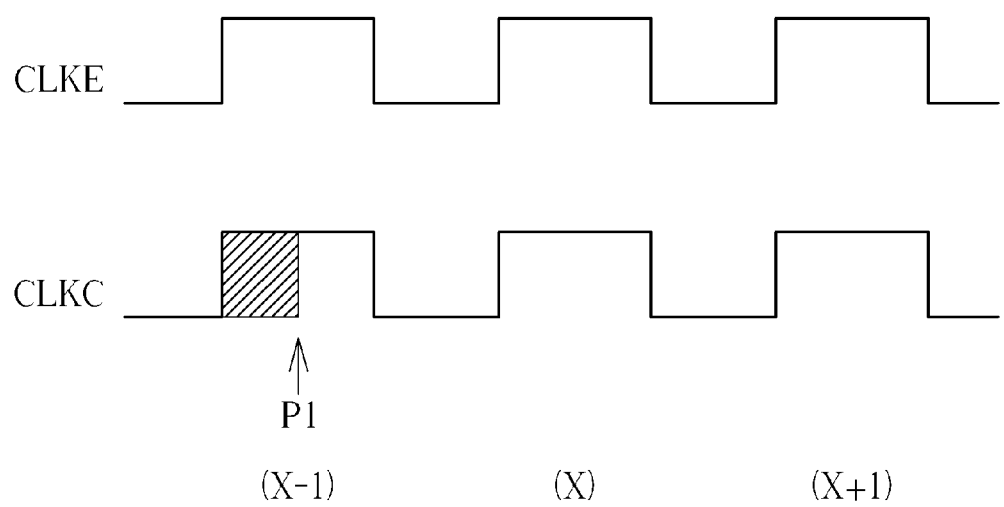
FIG. 5 is a timing diagram illustrating the external clock signal CLKE and the command triggering clock signal CLKC applied to the shifter in FIG. 4.

FIG. 4 is a block diagram illustrating a shifter 400 according to one embodiment of the present invention. FIG. 5 is a schematic diagram illustrating the external clock signal CLKE and the command triggering clock signal CLKC applied to the shifter in FIG. 4. Please jointly refer to FIG. 4 and FIG. 5 to understand the concept of the present invention more clearly. As shown in FIG. 4, the shifter 400 includes shifting stages 401, 403 and 405, which can be flip flops, arranged in series. The shifting stage 401 utilizes an external clock signal CLKE to sample a command signal CMD (X−2) to generate a first sampled command signal CMD (X−1). The second shifting stage 403 still utilizes the external clock signal CLKE to sample the first sampled command signal CMD (X−1) to generate a second sampled command signal CMD (X). The third shifting stage 405 utilizes a command triggering clock signal CLKC to sample the second sampled command signal CMD(X) to generate a third sampled command signal CMD(X+1). The shifter 400 also includes a command triggering clock signal 407 to generate the command triggering clock signal CLKC according to the command signal CMD(X−2).

Figure 1:
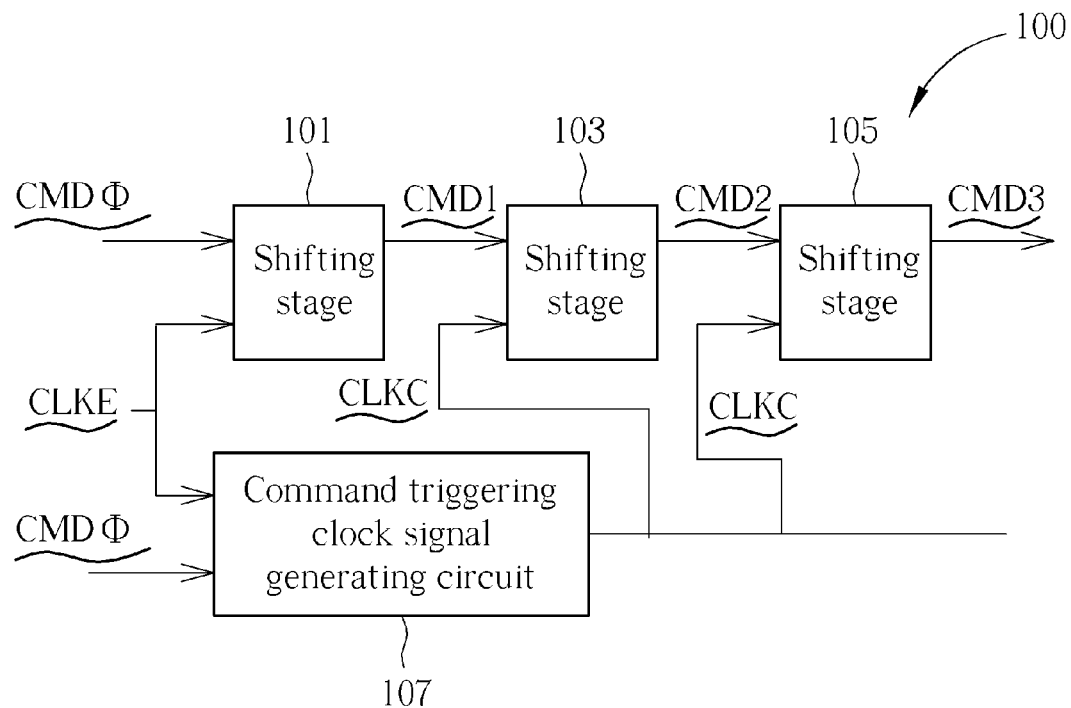
FIG. 1 is a block diagram illustrating a prior art shifter.
Figure 2:
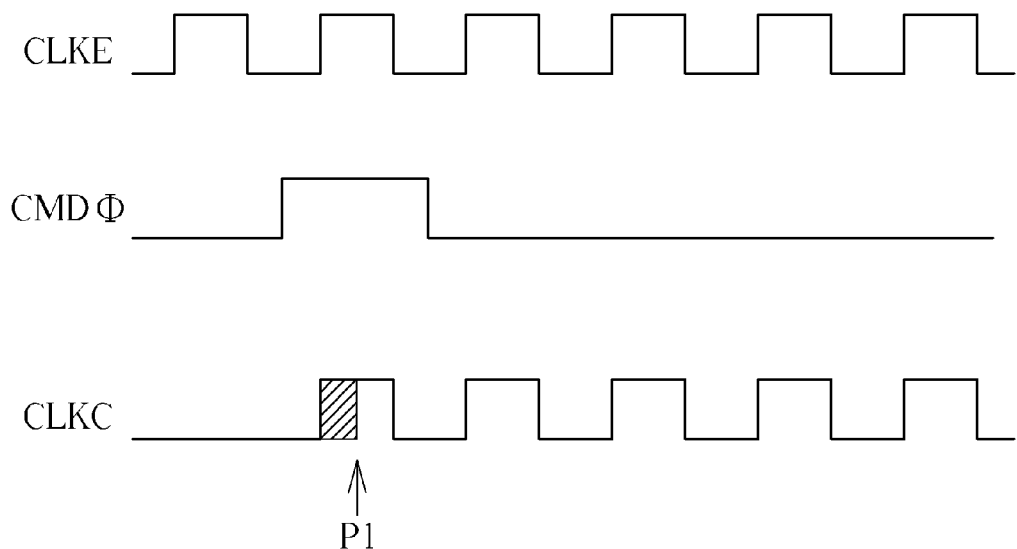
FIG. 2 is a timing diagram illustrating the external clock signal CLKE and the command triggering clock signal CLKC applied to the shifter in FIG. 1.
Figure 3:
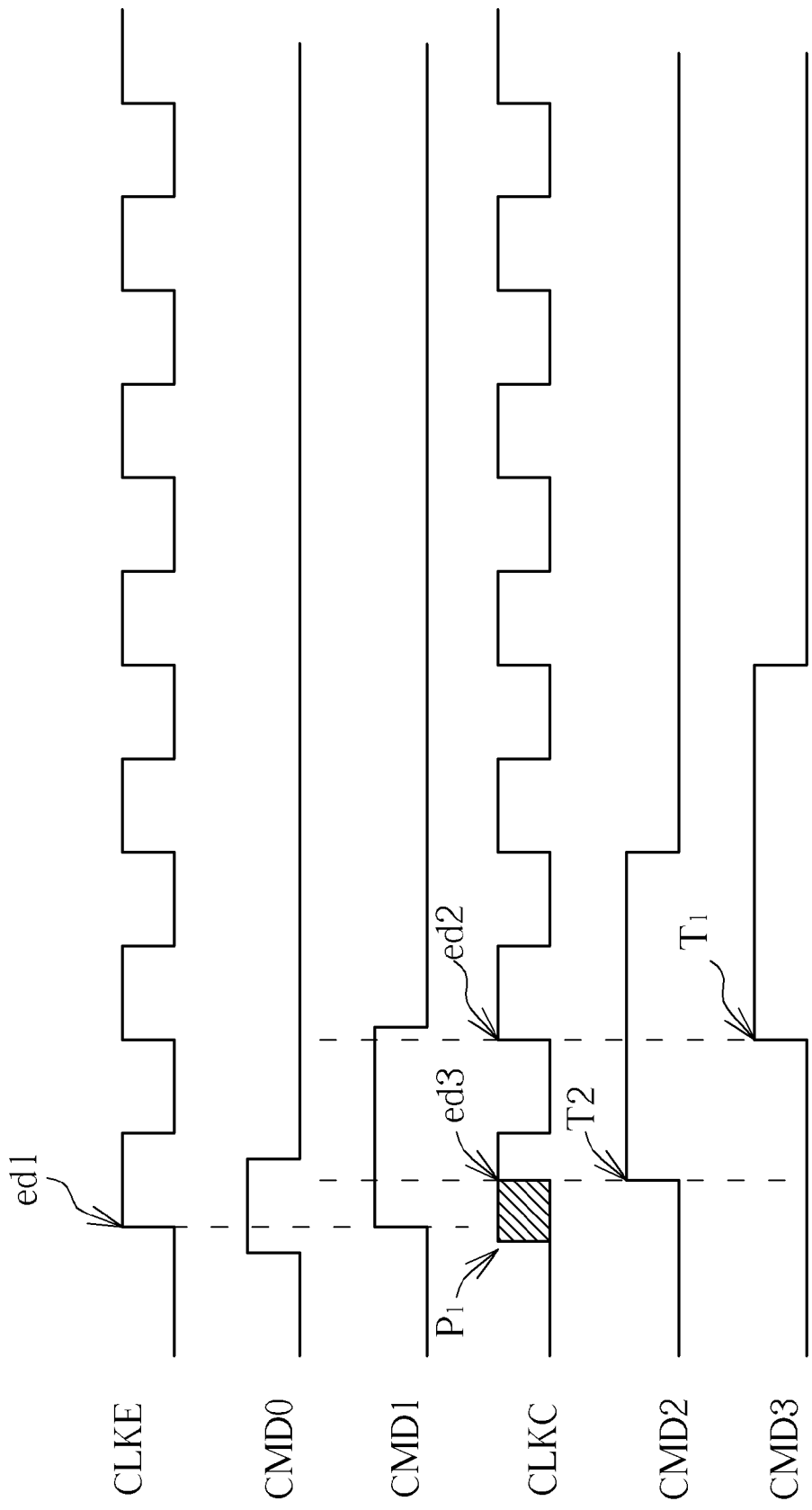
FIG. 3 is a timing diagram illustrating the relations between the clock signals and the command signals for the example shown in FIG. 1.

Please note if the shifter 400 utilizes the structure shown in FIG. 1, the second shifting stage 403 should utilize the command triggering clock signal CLKC to sample command input therein rather than the external clock signal CLKE. The shifting stages 401, 403 and 405 can be provided in any part of the shifter 400, that is, the shifting stage 401 can be a starting shifting stage in the shifter but also can be the shifting stage in any location of the shifter. Also, the structure is not limited to the embodiment shown in FIG. 4. For example, the shifting stage 405 can also be designed to utilize the external clock signal CLKE to sample command signal input therein, and the shifting stage next to the shifting stage 405 utilizes the command triggering clock signal CLKC.

Therefore, the shifter 400 shown in FIG. 4 can also be summarized as a shifter including: at least one shifting stage, for receiving an external clock signal CLKE or a command triggering clock signal CLKC to generate sampling signals (ex. CMD (X−1), CMD (X), or CMD (X+1)) according a command signal CMD (X−2); and a command triggering clock signal, for generating the command triggering clock signal CLKC according to the command signal. The shifting stage, such as 403 in FIG. 4, utilizes the external clock signal CLKE to generate the sampling signal but does not utilize the command triggering clock signal to generate the sampling signal, if the command triggering clock signal may have a partial pulse for a clock cycle the shifting stage generates the sampling signal.

In the embodiment shown in FIG. 4, the first pulse of CLKC P1 (typically determined by tCKmin of the design) occurs at cycle (X−1), thus indicating a partial pulse possibility exists at cycle (X−1) for CLKC. For this case, shifting stages 401 and 403 use the external clock signal CLKE, thus ensures that when the "partial" pulse in CLKC happens, there is no CMD(X) available at shifting stage 405 (first stage to encounter CLKC). In this case, as there is no data to sample, the partial pulse causes no harm. In the "partial" clock cycle CMD (X−1) is generated by the shifting stage 401. CMD (X−1) will propagate to CMD(X) in the next clock cycle (X).

Since the partial pulse happens at cycle (X−1), thus it is guaranteed that there can be no data at CMD(X) at the time of the partial pulse.

Figure 6:
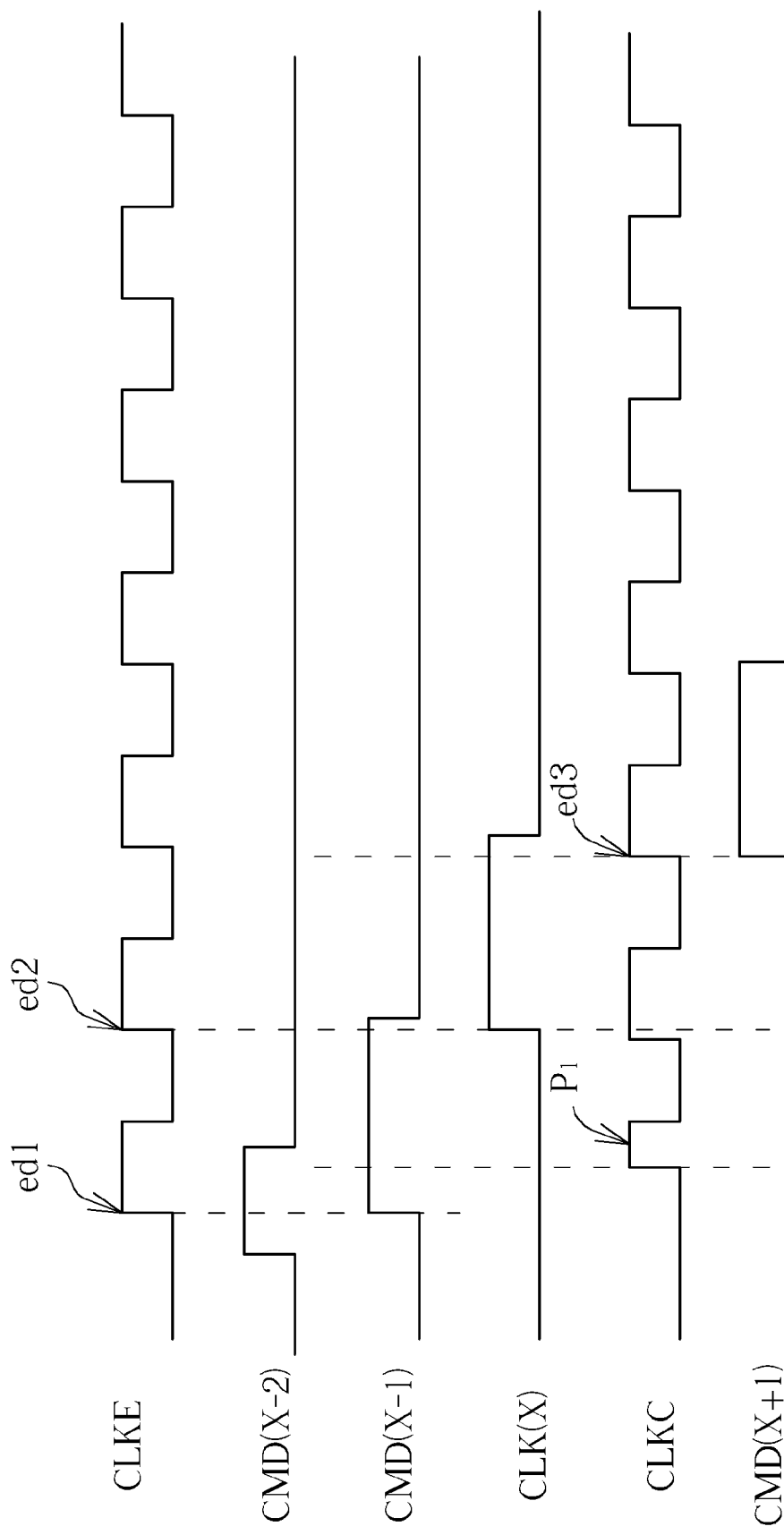
FIG. 6 is a timing diagram illustrating the relations between the clock signals and the command signals in the embodiment shown in FIG. 4.

FIG. 6 is a timing diagram illustrating the relations between the clock signals and the command signals in the embodiment shown in FIG. 4. AS shown in FIG. 6, the command signal CMD(X−2) is sampled by a rising edge ed1 of the external clock signal CLKE to thereby generate a high level of the command signal CMD (X−1). Additionally, the command signal CMD(X−1) is sampled by a rising edge ed2 of the external clock signal CLKE to thereby generate a high level of the command signal CMD (X). Then, the command signal CMD(X) is sampled by a rising edge ed3 of the command triggering clock signal CLKC to thereby generate a high level of the command signal CMD (X+1). Based on FIG. 6, the error caused by the partial pulse P1 can be avoided via the concept provided by the present invention since the partial pulse P1 is not utilized to sample any command signal.

In view of above-mentioned embodiments, the shifter can avoid utilizing the partial pulse to wrongly sample a command signal, since the command triggering clock signal CLKC is not utilized to sample the command signal during the cycle that CLKC is possible to have partial pulse.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shifter can avoid utilizing a partial pulse, comprising:
   a first shifting stage, for utilizing an external clock signal to sample a command signal to generate a first sampled command signal;
   a second shifting stage, for utilizing the external clock signal to sample the first sampled command signal to generate a second sampled command signal;
   a third shifting stage, for utilizing a command triggering clock signal to generate a third sampled command signal according to the second sampled command signal; and
   a command triggering clock signal generating circuit, for generating the command triggering clock signal according to the command signal;
   where the first shifting stage does not utilize the command triggering clock signal to sample the command signal, the second shifting stage does not utilize the command triggering clock signal to sample the first sampled command signal, and the third shifting stage does not utilize the external clock signal to generate the third sampled command signal according to the second sampled command signal.

2. The shifter of claim 1, wherein the external clock signal is directly transmitted to the shifting stage from an external clock source.

3. The shifter of claim 1, wherein the third shifting stage utilizes the command triggering clock signal to sample the second sampled command signal to generate the third sampled command signal.

4. The shifter of claim 1, wherein the first shifting stage is a starting shifting stage of the shifter.

5. The shifter of claim 1, wherein the first shifting stage, the second shifting stage, and the third shifting stage are flip flops.

* * * * *